United States Patent
Chang et al.

(10) Patent No.: US 8,569,848 B2
(45) Date of Patent: Oct. 29, 2013

(54) NANOTUBE PHONON WAVEGUIDE

(75) Inventors: Chih-Wei Chang, Berkeley, CA (US); Alexander K. Zettl, Kensington, CA (US)

(73) Assignee: The Regents of the University of California, Oakland, CA (US)

(*) Notice: Subject to any disclaimer, the term of this patent is extended or adjusted under 35 U.S.C. 154(b) by 969 days.

(21) Appl. No.: 12/505,586

(22) Filed: Jul. 20, 2009

(65) Prior Publication Data

US 2013/0255906 A1 Oct. 3, 2013

Related U.S. Application Data

(60) Provisional application No. 61/082,320, filed on Jul. 21, 2008.

(51) Int. Cl.
*H01L 27/14* (2006.01)

(52) U.S. Cl.
USPC .......................................... 257/414; 257/415

(58) Field of Classification Search
USPC ................ 257/706, 717, 414, 415, E23.101
See application file for complete search history.

(56) References Cited

U.S. PATENT DOCUMENTS

| | | | |
|---|---|---|---|
| 3,626,334 A | 12/1971 | Keyes | |
| 4,072,864 A | 2/1978 | von Gutfeld | |
| 4,349,796 A | 9/1982 | Chin et al. | |
| 5,641,466 A | 6/1997 | Ebbesen et al. | |
| 6,231,980 B1 | 5/2001 | Cohen et al. | |
| 6,882,051 B2 | 4/2005 | Majumdar et al. | |
| 7,068,865 B2 | 6/2006 | Hamann et al. | |
| 7,927,992 B2 * | 4/2011 | Ward et al. | 438/584 |
| 2007/0164270 A1 | 7/2007 | Majumdar et al. | |
| 2009/0277609 A1 * | 11/2009 | Chang et al. | 165/96 |

OTHER PUBLICATIONS

Jaeil Bai, et al., "Metallic single-walled silicon nanotubes," PNAS, Mar. 2, 2004, vol. 101, No. 9, 2664-2668.
C.W.Chang, et al., "Nanotube phonon waveguide", Phys. Rev. Lett., Jul. 27, 2007, 10.1103/PhysRevLett.99.045901.
Jean-Francois Guillemoles, et al., "Phononic engineering with nanostructures for hot carrier solar cells", Proc. 15th PVSEC, 2005, Shanghai, China, (Jan. 10, 2005), arXiv:cond-mat/0611045v1.
J.Hone, et al., "Quantized phonon spectrum of single-wall carbon nanotubes", Science, 2000, vol. 289, 1730-1733.
Evgenii P. Pokatilov, et al., "A phonon depletion effect in ultrathin heterostructures with acoustically mismatched layers", Applied Physics letters, Aug. 2, 2004, vol. 85, No. 5, 825-827.
K.Schwab, et al., "Measurement of the quantum of thermal conductance", Nature, Apr. 27, 2000, vol. 404, 974-977.
Date J.D. Moet, et al., "Hybrid polymer solar cells from highly reactive diethylzinc: MDMO-PPV versus P3HT", Chem. Mater., 2007, vol. 19, 5856-5861.
C.W.Chang, et al., "Solid-state thermal rectifier", Science, Nov. 17, 2006, vol. 314, No. 5802, 1121-1124.

* cited by examiner

*Primary Examiner* — Hung Vu
(74) *Attorney, Agent, or Firm* — David J. Aston; Peters Verny, LLP

(57) ABSTRACT

Disclosed are methods and devices in which certain types of nanotubes (e.g., carbon nanotubes and boron nitride nanotubes conduct heat with high efficiency and are therefore useful in electronic-type devices.

17 Claims, 6 Drawing Sheets

Fig. 3B Time sequence (mins)

Thermal transistor

NANOTUBE PHONON WAVEGUIDE

CROSS-REFERENCE TO RELATED APPLICATIONS

This application claims priority from U.S. Provisional Patent Application No. 61/082,320, filed on Jul. 21, 2008, which is hereby incorporated by reference in its entirety.

STATEMENT OF GOVERNMENTAL SUPPORT

This invention was made with U.S. Government support under National Science Foundation under Grant No. EEC-0425914 and Contract Number DE-AC02-05CH11231 between the U.S. Department of Energy and The Regents of the University of California for the management and operation of the Lawrence Berkeley National Laboratory. The U.S. Government has certain rights in this invention.

REFERENCE TO SEQUENCE LISTING, COMPUTER PROGRAM, OR COMPACT DISK

None

BACKGROUND OF THE INVENTION

1. Field of the Invention

The present invention relates to the field of nanomaterials such as carbon nanotubes and further to the field of phonon (heat) waveguides.

2. Related Art

Presented below is background information on certain aspects of the present invention as they may relate to technical features referred to in the detailed description, but not necessarily described in detail. The discussion below should not be construed as an admission as to the relevance of the information to the claimed invention or the prior art effect of the material described.

When a sample of material is heated on one end, energy will flow to the cold end. In solid material, heat can be carried either by mobile electrons or by atoms vibrating around their fixed, equilibrium positions. Insulating materials do not contain mobile electrons, and, as a result, only atomic vibrations can transport heat in insulators. These vibrations are not random: the atoms move collectively so that together they form waves, called phonons.

Cylindrical-structured materials such as carbon nanotubes (CNTs) or boron nitride nanotubes (BNNTs) have been known to exhibit many unique properties. These include high electronic mobility, high current-carrying capacity, high Young's modulus, high tensile strength, and high thermal conductivity[1]. While an enormous amount of work has been devoted to investigating their electrical and mechanical properties, few have explored the thermal behavior of an individual nanotube[2-4]. This is mainly due to the elaborate microfabrication processes required to construct the suspended thermal devices for an individual nanotube, as well as the difficulty in positioning a nanotube at the desired location. Recently, we have overcome these difficulties and successfully measured the isotope effect of the thermal conductivity of BNNTs. Described below is a phonon waveguide having special properties as shown by the in-situ transport measurement of an individual CNT against structural deformation. The resistance and thermopower show a reversible band-gap tuning against strain. In contrast, their thermal conductivity remains unperturbed under large deformation. More surprisingly, these features hold not only for global bending, but also for local buckling where the radius of curvature is comparable to the phonon mean free path. Furthermore, these unique thermal transport properties are also exhibited in BNNTs. Our findings suggest that nanotubes not only can be sensitive electromechanical devices but are also excellent and robust phonon waveguides with properties unknown to any other materials.

3. Specific Patents and Publications

Chang et al. "Nanotube Phonon Waveguide," *Phys. Rev. Lett.*, 99:045901-1 04590-4 (published on line Jul. 25, 2007) was derived from the work described here.

U.S. Pat. No. 3,626,334 to Keyes, issued Dec. 7, 1971, entitled "Electrically Variable Acoustic Delay Line," discloses that a semiconductor can be perturbed by various methods of doping. Ion implantation, alloying, or neutron irradiation of the semiconductor can be relied upon in addition to diffusion to attain the phonon wave-guiding action, wherein the phonons are acoustic.

Pokatilov et al. "A phonon depletion effect in ultrathin heterostructures with acoustically mismatched layers," *App. Phys. Lett.*, 85(5): 825-827 (2004) discloses theoretically that modification of acoustic phonon spectrum in heterostructures with large acoustic impedance mismatch at the interface may lead to the strong phonon depletion in the core layer.

Schwab et al., "Measurement of the quantum of thermal conductance," *Nature*, 404, 974-977 (2000) discloses that the thermal conductance of phonon waveguides in the ballistic, one-dimensional limit had been calculated using the Landauer formula. In this publication, the authors further report that they developed new fabrication techniques based on initial work on thermally isolated mesoscopic samples with integrated transducers. Their device includes a phonon 'cavity' (a quasi-isolated thermal reservoir) suspended by four phonon 'waveguides'. These are fabricated from a 60-nm-thick silicon nitride membrane by electron beam lithography and pattern transfer technique.

Hone et al., "Thermal conductivity of single-walled carbon nanotubes," *Phys. Rev. B*, 59, R2514-R2516 (1999) discloses that the temperature-dependent thermal conductivity κ(T) of crystalline ropes of single-walled carbon nanotubes from 350 K to 8 K. κ(T) decreases smoothly with decreasing temperature, and displays linear temperature dependence below 30 K. Comparison with electrical conductivity experiments indicates that the room-temperature thermal conductivity of a single nanotube may be comparable to that of diamond or in-plane graphite, i.e., is quite high.

Chang et al., "Solid-State Thermal Rectifier," *Science*, 17 Nov. 2006:Vol. 314. no. 5802, pp. 1121-1124 discloses that high-thermal-conductivity carbon and boron nitride nanotubes mass-loaded externally and inhomogeneously with heavy molecules were produced. The resulting nanoscale system yields asymmetric axial thermal conductance with greater heat flow in the direction of decreasing mass density.

U.S. Pat. No. 4,349,796, entitled "Devices incorporating phonon filters," discloses an acoustic superlattice of alternating layers of different acoustic impedance as a filter for high frequency phonons. Applications discussed include spectrometers, acoustic imaging apparatus, and cavity resonators.

BRIEF SUMMARY OF THE INVENTION

The following brief summary is not intended to include all features and aspects of the present invention, nor does it imply that the invention must include all features and aspects discussed in this summary.

The present invention thus may, in certain aspects, be regarded as a nanotube phonon waveguide, comprising a heat source, a heat sensor or receiver, a nanotube attached to the heat source and the heat sensor, where the nanotube is or may be bent to a certain extent, e.g., as described below. Further, the device comprises said nanotube being mechanically deformed, i.e., deflected from a straight line, or attached at its ends so that it can be deformed, and a heat sensor for detecting phonon heat transmission through the nanotube. The heat source may operate around room temperature, or may provide heat between −273° C. and 3000° C., and, as a subrange, of 50° to 100°. The device may only transmit and sense heat, or it may also comprise an electronic source and the sensor also senses electron flow through the nanotube. The nanotube used may be one of an SWNT, MWCNT, (including metallic and semiconducting, and graphyne nanotubes (GNTs)) BNNT, (boron nitride nanotubes having either single or multiple layers), and silicon nanotubes, and, in arrays, mixtures thereof. The nanotubes may be between about 10 nm to 108 nm (in length), preferably about 10 nm to 40 nm.

The device may contain structure permitting differential deformation of the nanotube, and wherein the nanotube may be deformed. That is, the ends are moved in a predetermined fashion to deform the nanotubes. The differential deformation can then be coupled to the sensor to act as a band pass filter to selectively transmit certain phonon wavelengths, wherein thermal conductivity increases with deformation, in that there is a semiconducting to metal transition during bending. In addition, since phonon transmission is only minimally affected by deformation but electron transmission is more significantly affected, the device may couple the two. In that case, the heat source is also an electronic source and the sensor also senses electron flow through the nanotube, and said sensor is adapted to detect greater electronic resistance with greater deformation.

The present device may comprise an actuator for applying force along the axis of the nanotube(s) to cause it to buckle or bend, such as shown in FIG. 2A.

The present device enables the use of phonon signals as an information-carrying mode, much like electrons carry electronic signals. It should be understood that the basic heat source, drain and signal devices referred to here can be designed to transmit capture and detect rapid variations in phonon transport, thus, as a result of the information presented here, being comparable to optical fibers.

BRIEF DESCRIPTION OF THE DRAWINGS

FIG. 3B is a graph which shows the thermal conductivity change of CNT sample 2 (open triangles) and CNT sample 3 (solid circles). The inset of the middle panel shows the TEM image after the defect was created in CNT sample 3 (scale bar=50 nm).

DETAILED DESCRIPTION OF THE PREFERRED EMBODIMENT

Definitions

Figure 1:
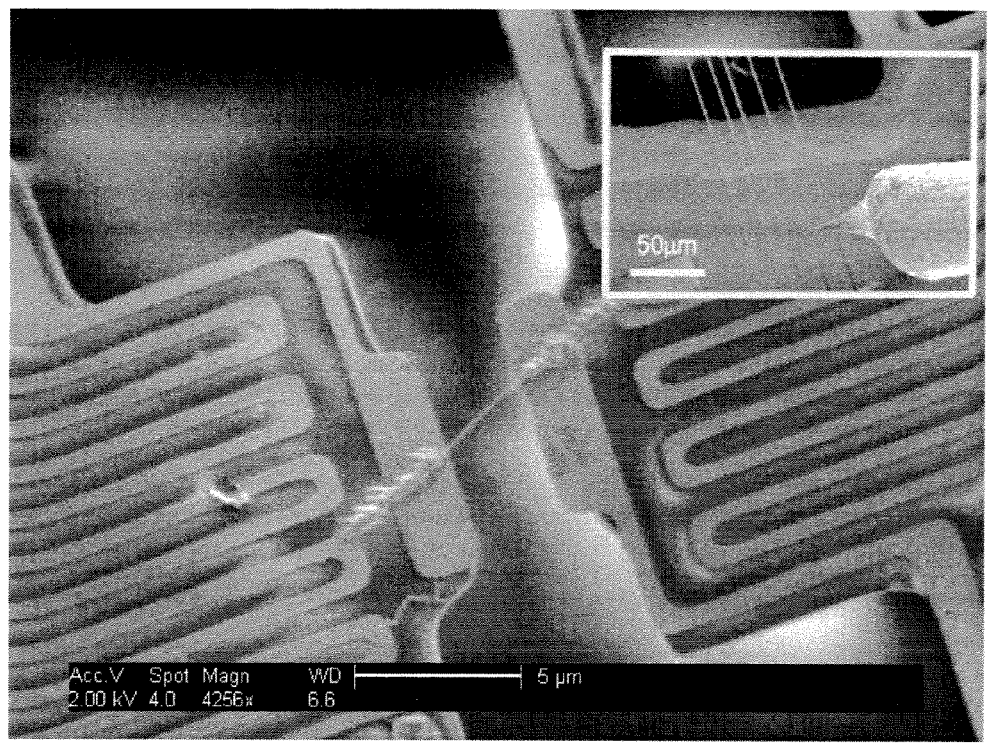
FIG. 1 is an SEM image of the microfabricated test fixture with a BNNT bonded with $(CH_3)_3(CH_3C_5H_4)Pt$ on the electrodes (scale bar=5 μm). The inset shows the experimental configuration when using the manipulator ("actuator") to push the device without affecting the heat profile (scale bar=50 μm).

Unless defined otherwise, all technical and scientific terms used herein have the same meaning as commonly understood by those of ordinary skill in the art to which this invention belongs. Although any methods and materials similar or equivalent to those described herein can be used in the practice or testing of the present invention, the preferred methods and materials are described. Generally, nomenclatures utilized in connection with, and techniques of, cell and molecular biology and chemistry are those well known and commonly used in the art. Certain experimental techniques, not specifically defined, are generally performed according to conventional methods well known in the art and as described in various general and more specific references that are cited and discussed throughout the present specification. For purposes of the clarity, following terms are defined below.

"Nanotube" means a nanoscale sized cylindrical molecule comprising a regular ordering of atoms. Nanotubes according to the present invention include carbon nanotubes, either multiwalled, or single walled, as well as non-carbon nanotubes, such as boron nitride nanotubes and silicon nanotubes, as described in Metallic single-walled silicon nanotubes, e.g., as described in Bai, et al., "Metallic single-walled silicon nanotubes," *PNAS*, Mar. 2, 2004 vol. 101 no. 9 2664-2668.

"Nanoscale" means a size less than 1 μm (1000 nm).

"MWCNT" means a carbon multiwalled nanotube.

"Phonon" means a quantized mode of vibration occurring in a rigid crystal lattice, such as the atomic lattice of a solid. Phonons are a quantum mechanical version of a special type of vibrational motion, known as normal modes in classical mechanics, in which each part of a lattice oscillates with the same frequency. As used herein, a phonon is a packet of energy, in the sense that the total energy of an oscillating system can be incremented or decremented by only integer multiples of a certain fixed amount. This smallest difference is called a phonon and is treated like a "particle" because one may study the changes in the energy of the system as the creation and destruction of these particles. Thus, phonon heat transfer, as discussed below, refers to a quantum mechanistic model of heat transfer in non-metallic solids propagated by lattice vibrations. The total thermal conductivity of a solid is hence, the sum of the electronic and phononic contributions. But these contributions are not independent of each other or of the temperature of the solid. As reported by Hone et al., "Quantized phonon spectrum of single-wall carbon nanotubes," *Science*, 2000 Sep. 8; 289(5485):1730-3, the electronic spectra of carbon nanotubes and other nanoscale systems are quantized because of their small radii. Similar quantization in the phonon spectra has been difficult to observe because of the far smaller energy scale. However the authors were able to measure the temperature-dependent specific heat of purified single-wall nanotubes. The data showed direct evidence of one-dimensional quantized phonon sub-bands.

Overview

The present nanotube phonon wave-guide primarily serves to guide heat currents on arbitrary paths. Unlike electrical conductivity, which can vary by more than 27 orders of magnitude from insulators to metals, thermal conductivity varies by less than a factor of $10^4$ at room temperature from the best thermal conductors to the best thermal insulators. Thus, although it is very easy to guide electrical currents, it is very difficult to guide heat currents. Optical fibers were invented to guide light (or photons) at arbitrary paths, but when bending an optical fiber, for example 90°, the total transmission ability is degraded. Due to nanotubes' intrinsic high thermal conductivity along their axial direction and poor thermal conductivity in the radial direction, the nanotube phonon waveguide serves as an excellent heat conduction channel that can confine heat currents within nanoscale. At the same time, unlike optical fibers, the thermal conductivity does not degrade even if the bending radius of curvature is less than 70 nm. It can be said that for phonons, nanotube phonon waveguides are superior to their counterparts for photons, such as optical fibers. Accordingly, it should be understood that the present devices may be constructed so that the nanotube does not convey electrons or photons (electromagnetic radiation), only phonons.

Devices that control the transmission of electromagnetic radiation, as opposed to devices that control the transmission of heat, are well known. They are usually classified according to the applicable wavelength of the transmitted radiation (e.g., power transmission lines, RF coaxial cable, microwave waveguide, fiber-optic cable, etc.). Interestingly, few analogous thermal counterparts exist. Certainly good metals are usually good thermal conductors as well, where the electrons carry both the electrical current and the thermal current. However, a select number of crystalline insulators are also good thermal conductors, and here the heat is carried by phonons. In fact, the best thermal conductor is diamond, a wide-bandgap insulator. The problem is that small imperfections of mechanical distortions of materials such as diamond have a deleterious effect on the thermal conductance. Multiwall nanotubes have a very high intrinsic thermal conductance. If the nanotube membrane is damaged, the thermal conductance is decreased. This invention involves the use of nanotubes as high throughput phonon (heat) waveguides. It is demonstrated that, even under conditions of severe mechanical deformation, the nanotubes continue to serve as efficient thermal conductors. This is particularly useful for flexible electronics and composites subject to mechanical strains.

MWCNTs

The preferred material for the present phonon waveguides are multiwalled carbon nanotube (MWCNT). MWCNTs have a near perfect carbon tubule structure that resembles a sheet of $sp^2$ bonded carbon atoms rolled into a seamless tube.

They are generally produced by one of three techniques, namely electric arc discharge, laser ablation and chemical vapor deposition.

The arc discharge technique involves the generation of an electric arc between two graphite electrodes, one of which is usually filled with a catalyst metal powder (e.g., iron, nickel, cobalt), in a Helium atmosphere. A detailed procedure of an arc technique is described in Ebbesen et al. U.S. Pat. No. 5,641,466 issued Jun. 24, 1997, for large-scale synthesis of carbon nanotubes. In an inert gas at a pressure of 200-2500 torr, an arc discharge is made between two carbon rod electrodes by application of a suitable AC or DC voltage (e.g., about 18 V) to thereby produce a carbon plasma. The electric current is about 50-100 A. As the result a carbon deposit forms on the end of one of the two carbon rods, and a core part of the carbon deposit contains a large amount of carbon nanotubes. This core part can easily be separated from a shell part in which no carbon nanotubes exist. Usually carbon nanotubes occupy more than 65 wt % of the core part of the deposit, and the nanotubes coexist with some (less than 35 wt %) carbon nanoparticles, which are nanometer-scale carbon particles with polyhedral cage structures. Sometimes a small amount of amorphous carbon also coexists. These nanotubes have a near perfect carbon tubule structure that resembles a sheet of $sp^2$ bonded carbon atoms rolled into a seamless tube.

The laser ablation method uses a laser to evaporate a graphite target which is usually filled with a catalyst metal powder too. The arc discharge and laser ablation techniques tend to produce an ensemble of carbonaceous material, which contain nanotubes (30-70%), amorphous carbon and carbon particles (usually closed-caged ones). The nanotubes must then be extracted by some form of purification process before being manipulated into place for specific applications.

The chemical vapor deposition process utilizes nanoparticles of metal catalyst to react with a hydrocarbon gas at temperatures of 500-900° C. A variant of this is plasma enhanced chemical vapor deposition in which vertically aligned carbon nanotubes can easily be grown. In these chemical vapor deposition processes, the catalyst decomposes the hydrocarbon gas to produce carbon and hydrogen. The carbon dissolves into the particle and precipitates out from its circumference as the carbon nanotube. Thus, the catalyst acts as a 'template' from which the carbon nanotube is formed, and by controlling the catalyst size and reaction time, one can easily tailor the nanotube diameter and length respectively to suit. Carbon tubes, in contrast to a solid carbon filament, will tend to form when the catalyst particle is ~50 nm or less because if a filament of graphitic sheets were to form, it would contain an enormous percentage of 'edge' atoms in the structure.

Alternatively, nanotubes may be prepared by catalytic pyrolysis of hydrocarbons as described by Endo, et al., in *J. Phys. Chem. Solids,* 54, 1841 (1993), or by Terroner, et al., in Nature, 388, 52 (1997) or by Kyotani, et al., in *Chem. Mater.,* 8, 2190 (1996), the contents of all of which are incorporated by reference.

The strength of the $sp^2$ carbon-carbon bonds gives carbon nanotubes particular mechanical properties. The stiffness of the material, measured in terms of its Young's modulus, the rate of change of stress with applied strain, can be as high as 1000 GPa, which is approximately 5× higher than steel. The tensile strength, or breaking strain of nanotubes can be up to 63 GPa, around 50× higher than steel. These properties, coupled with the lightness of carbon nanotubes make them particularly preferred in the present thermal link.

Other forms of nanotube may be used as phonon waveguides as described here, so long as they have uniform mechanical and thermal properties and comprise a rigid crystal lattice for efficient phonon transport. For example, $BC_2N$ or BN nanotubes, as described in Zettl, "Non-Carbon Nanotubes," *Adv. Mat.,* 8(5):443-445 (1996). Multiwalled nanotubes made of boron nitride are also described in Goldberg et al., "Multi-walled boron nitride nanotubes composed of diverse cross-section and helix type shells," *Applied Physics A: Materials Science & Processing,* Volume 88, Number 2/August, 2007, and references cited there.

For the studies described below, MWCNTs with diameters ranging from 10 nm to 33 nm were prepared using conventional arc methods[5]. Multiwall BNNTs were synthesized using an adaptation of a previously reported method, yielding samples with typical outer diameter 30~40 nm and length ~10 μm. Individual tubes were placed on a custom designed microscale thermal conductivity test fixture using a piezo-driven manipulator operated inside an SEM.

BNNTs

The term BNNT, or "boron nitride nanotube" means materials having crystalline walls were formulated comprising a variety of stoichiometries of $B_xC_yN_z$. Typically x, y, and z are integers including zero, where no more than one of x, y, and z are zero for a given stoichiometry. These nanotubes and nanoparticles may comprise carbon combined with boron and/or nitrogen. In a different embodiment, the BNNT nanotubes and nanoparticles comprise essentially only boron and nitrogen. Both BNNTs and MWCNTs can be doped with other elements or molecules to alter their thermal properties. Examples of doping elements are boron, carbon, nitrogen, aluminum, silicon, phosphorous, beryllium, oxygen, and any of the alkali atoms.

Synthesis of BNNTs may be carried out in accordance with methods and instruments described in U.S. Pat. No. 6,231,980 to Cohen, et al., issued May 15, 2001, entitled "BX CY NZ nanotubes and nanoparticles." It is also described in a journal article co-authored by the inventors (Weng-Sieh et al., *Phys Rev B*, 51(16):11229, 1995).

Phonon Properties

As described in more detail in the examples below, the electrical resistance, thermopower and thermal conductivity responses of individual carbon nanotubes (CNTs) and boron-nitride nanotubes (BNNTs) were measured in-situ while bending the nanotubes into different shapes. We found that, although the electrical resistance and thermopower of the CNTs show reversible modulation against deformation, the thermal conductivity remains unperturbed even when bending the nanotubes into a radius of curvature comparable to the phonon mean free path. These results demonstrate that nanotubes cannot only be used in nanoelectromechanical devices but also are excellent and robust phonon waveguides.

Again, as described further below, nanotubes show remarkable thermal conductivity, which is not altered by deformation, i.e., bending along their length. This finding enables the use of these materials as waveguides, where the waves being transported are in the form of phonons. For an ordinary electromagnetic waveguide, a slight deformation will create mismatching of modes, thus results in a significant power loss. For an optical fiber, the minimum radius of curvature for bending is set by the relative refraction index, and is usually much larger than the wavelength of light. Here we show that nanotubes can be bent to a radius of curvature comparable to the phonon mean free path without losing its high thermal conductivity properties. Therefore, nanotubes not only can be sensitive nanoelectromechanical devices, but also extremely good and robust broadband phonon waveguides.

As described below, the nanotubes may be deformed by having their ends pressed towards each other while retaining relatively consistent thermal conductivity. It is postulated that, when the nanotubes are extremely deformed, thermal conductivity is limited only by the phonon mean free path. That is, theoretically, even if no defects or dislocations are present; the thermal conductivity of an object will start to decrease when its radius of curvature is smaller than the phonon mean free path. Thus the phonon mean free path sets an ultimate limit to the minimum radius of curvature beyond which the thermal conductivity starts to decrease. The robustness of phonon transports of CNTs or BNNTs does not violate, though it is close to, this ultimate limit.

EXAMPLES

Example 1

Preparation of a Nanotube Spanning a Heater and a Sensor Pad

FIG. 1 shows a scanning electron microscopy (SEM) image of the central portion of a test fixture with a BNNT spanning the heat source/sink pads. Details of the test fixture fabrication process have been published elsewhere[6]. In brief, the fixture incorporates independently suspended heat source and heat sink pads, with integrated Pt film resistors serving symmetrically either as heaters or sensors (i.e., thermometers). In addition, two independent beams are used for resistance/thermopower measurements. The fixture was made adaptable to transmission electron microscopy (TEM) imaging by wet etching a window through the exposed Si below the sample mount region. As shown in FIG. 1, nanotubes were strongly bonded to the source/sink pads using (trimethyl) methylcyclopentadienyl platinum $((CH_3)_3(CH_3C_5H_4)Pt)$ for mechanical strength and to reduce contact resistance.

For in-situ bending vs. electrical/thermal measurement, a sharpened tungsten tip mounted on a piezo-driven manipulator inside an SEM was used to push one of the resistance/thermopower beams near the end of the suspended device (shown in the inset of FIG. 1). This would bend the nanotube but also minimize the heat loss through the tungsten tip. We have found that the heat loss through the tungsten tip is negligible. For thermal conductivity measurements, a known power (P) was supplied to the heater, and resistance changes of the heater and sensor were used to determine the resulting temperature changes of the heater and sensor pads, $\Delta T_h$ and $\Delta T_s$. A blank device (with no nanotube present) was also used to determine the background heat leakage, subsequently used for data correction. The thermal conductance (K) of the nanotube was determined from $\Delta T_h$ and $\Delta T_s$ using the relation:

$$K = \frac{P}{\Delta T_h - \Delta T_s}\left(\frac{\Delta T_s}{\Delta T_h + \Delta T_s}\right) \qquad (1)$$

The thermal conductivity was then evaluated by incorporating the nanotube length and the annular area between inner and outer nanotube radius, as determined from TEM imaging. The resistance and thermopower can be measured correspondingly, with careful subtraction of the contribution of the Pt films. All the measurements were done at room temperature.

Example 2

Figure 2:
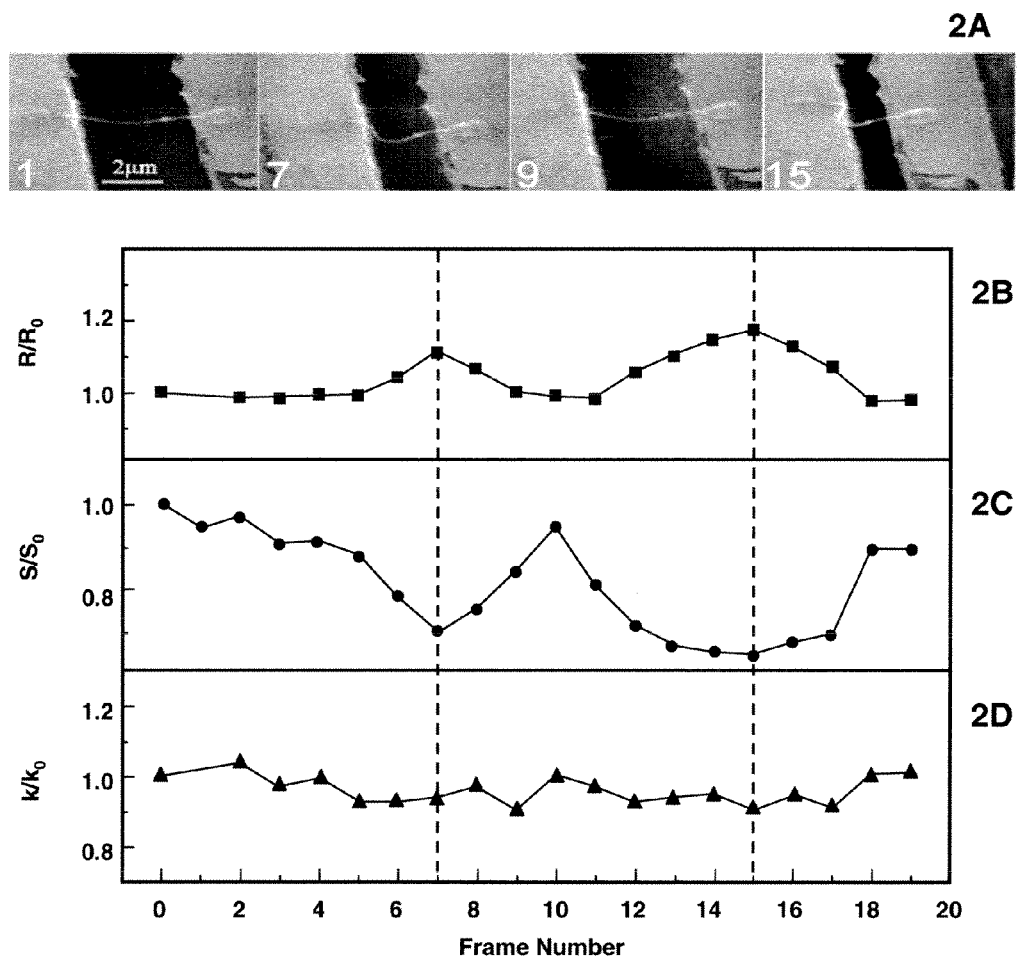
FIG. 2A is a series of representative SEM images of CNT sample #1, as in FIG. 1, undergoing two cyclic bendings. The number in each frame denotes the time sequence number (scale bar=2 μm).
FIG. 2B shows the resistance change.
FIG. 2C shows the thermopower change.
FIG. 2D shows the thermal conductivity change with respect to time sequence.

Changes of Electrical Resistance, Thermopower, and Thermal Conductivity of a Nanotube During Deformation The upper part of FIG. 2 shows a series of representative SEM images with two cyclic bendings of CNT sample 1. The corresponding changes of the electrical resistance, thermopower, and thermal conductivity are shown in the lower part of FIG. 2. Their values are normalized to the initial quantities of 44 kΩ, −42 μV/K, and 1050 W/mK, respectively. The resistance shows a cyclic 20% modulation against deformation. It reaches maximum when the bending angle is largest, indicating a band-gap opening under deformation. Since the total conductance of a multiwall CNT is dominated by the metallic channels, FIG. 2B indicates that there is a metal to semiconducting transition when bending metallic tubes. The result is consistent with previous experiments[7]. It is also consistent with theoretical preconditions that suggest a band-gap opening when bending metallic CNTs[8].

The total thermopower (S) of a multiwall CNT can be expressed by a two band model $$S = \frac{G_{metal} S_{metal}}{G_{metal} + G_{semi}} + \frac{G_{semi} S_{semi}}{G_{metal} + G_{semi}} \quad (2)$$

where the G's are conductance of the metallic and semiconducting channels, respectively. Although $S_{metal}$ is one order of magnitude smaller than $S_{semi}$, the contribution to $S_{total}$ from the first term in Eq. (1) is largely enhanced by $G_{metal}$, which can be more than three orders of magnitudes larger than $G_{semi}$. Thus the change of $S_{total}$ largely reflects the change in $G_{metal}$. As Eq. (1) suggests, a band-gap-opening will decrease $G_{metal}$, resulting in a decrease of $|S_{total}|$. Previous experiments have shown that the thermopower of CNTs is sensitive to oxygen absorption, molecular collisions and gate voltages[12-15]; here we show that it is also sensitive to mechanical deformation.

In contrast, although the thermal conductivity curve shows a 10% fluctuation in FIG. 2D, there is no clear correlation between the thermal conductivity and the bending angles. It is especially dramatic at the two extremes where the bending angles (determined by the projective images) are larger than 90° and 130°, respectively. Since the nanotubes generally move out of the projection plane (as clearly seen in the 15th frame of FIG. 2A and also in the 13th frame of FIG. 3) and the height difference between the heater and sensor is smaller than 100 nm, the real bending angles should be larger than the projective angles. The thermal conductivity fluctuation may be due to perturbations in the contacts under large strain. Applying the Wiedemann-Franz law to FIG. 2D, we can estimate that the electronic contribution to the total thermal conductivity is less than 1%. The result is consistent with previous theoretical and experimental results[16-18].

Although it has been shown that CNTs are remarkably flexible and resilient[19], the robustness of the thermal conductivity against deformation is still surprising. A ripple-like structure has been observed when bending a multiwall CNT[20]. Generally, the "wavelength" of the ripple is ~10 nm for a radius of curvature of ~400 nm and it decreases as the bending angle increases. With a radius of curvature of ~260 nm as in the 15th frame in FIG. 2A, one would expect that these ripples would scatter phonons efficiently because the phonon mean free path (~200 nm) is much longer than the wavelength of the ripple. Thus it is surprising that the thermal conductivity of the CNT remains unperturbed when the bending angle is larger than 130°.

Example 3

Insensitivity of Thermal Conductivity of MWCNTs by Cyclic Deformation

Figure 3A:
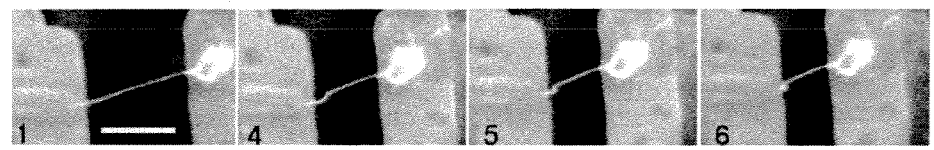
FIG. 3A is a series of representative SEM images of CNT sample #2 undergoing one cycle of bending (scale bar=2 μm).
Figure 3C:
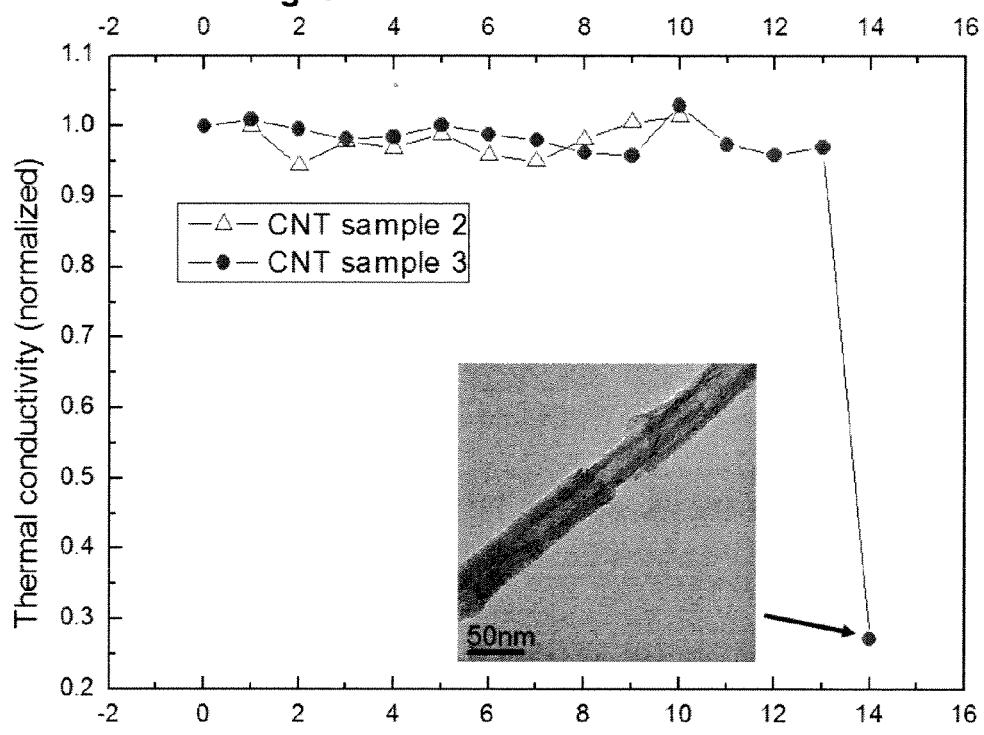
FIG. 3C is a series of representative SEM images of CNT sample 3 undergoing the third cycle of bending (scale bar=2 μm). The number in each frame denotes the time sequence in each sample, respectively
Figure 3C:
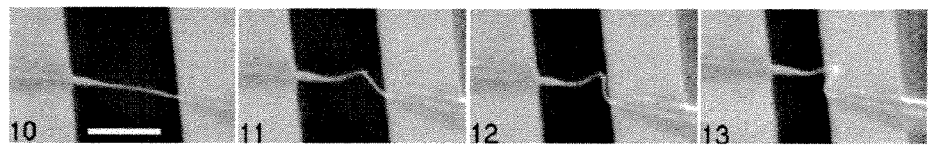

FIG. 3 shows two CNTs under cyclic deformation. The thermal conductivity is normalized to the initial values of 290 W/mK and 305 W/mK for CNT samples 2 and 3, respectively. At the extremes, the CNTs are bent at angles larger than 125° and 140°, respectively. Unlike FIG. 2, here the two CNTs are buckled locally so their radii of curvature are smaller (~70 nm and ~90 nm, for CNT samples 2 and 3, respectively). Remarkably, the thermal conductivity remains unchanged when the radius of curvature is comparable to their phonon mean free path (~50 nm). As shown in the last data point of CNT sample 3, the thermal conductivity starts to decrease only when some permanent defects are created by suddenly releasing the device under strain. The TEM image in the inset of FIG. 3 clearly displays such defects.

To investigate whether this unique property is universal, we extended our study to BNNTs. BNNTs are known to have comparable Young's modulus, phonon dispersion relation and thermal conductivity as those of CNTs, but because of their large band gap, their thermal properties are purely phononic. We have also found that, like CNTs, the thermal conductivity of BNNTs does not change until permanent defects are created.

Although we can qualitatively explain the observed correlation of the resistance and thermopower of CNTs under deformation, it is difficult to understand the robustness of the thermal conductivity of CNTs and BNNTs from a traditional point of view. In reality, most materials under strain will create defects or dislocations and thus reduce their thermal conductivity. So it is surprising that CNTs or BNNTs do not create permanent defects when bending the nanotubes at angles larger than 140°. More surprisingly, their phonon mean free path exceeds the wavelength created by the ensuing ripple-structures.

Example 4

Devices Incorporating Nanotube Phonon Waveguides

Figure 4:
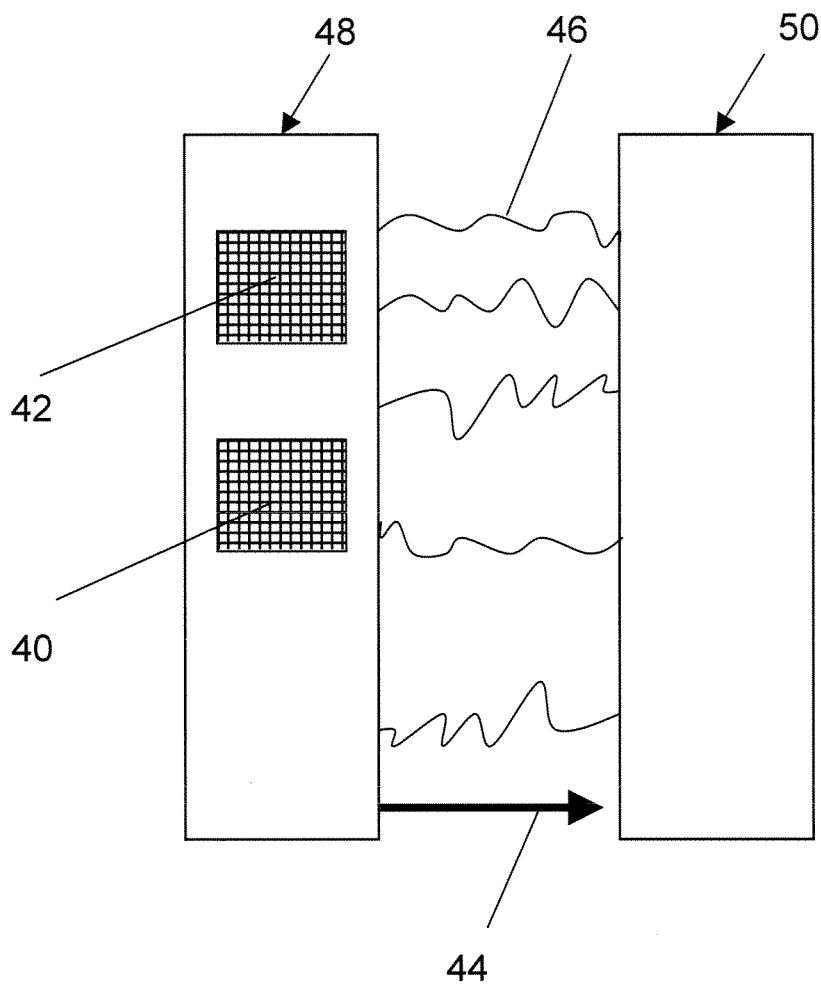
FIG. 4 is a schematic drawing of a waveguide device using the present deformed nanotubes.

FIG. 4 shows schematically a heat source connected to a heat sink by a plurality of deformed nanotubes. The heat source may be an electronic device such as an ultra-thin silicon-on-insulator (SOI) structure, which is to be cooled by delivery of heat to the sink, which may be silicon dioxide. Two microelectronic devices 40,42 in close proximity are shielded by preferential transfer of heat in the direction of arrow 44. Thus nanotubes 46 connect heat source 48 with heat sink 50 and heat or information flows in the direction of arrow 44 from heat source to heat sink.

In addition, the present nanotubes may be used as information carriers in combination with other "phononic" devices. Such devices include solid-state thermal rectifiers, and tunable thermal links.

Figure 5:
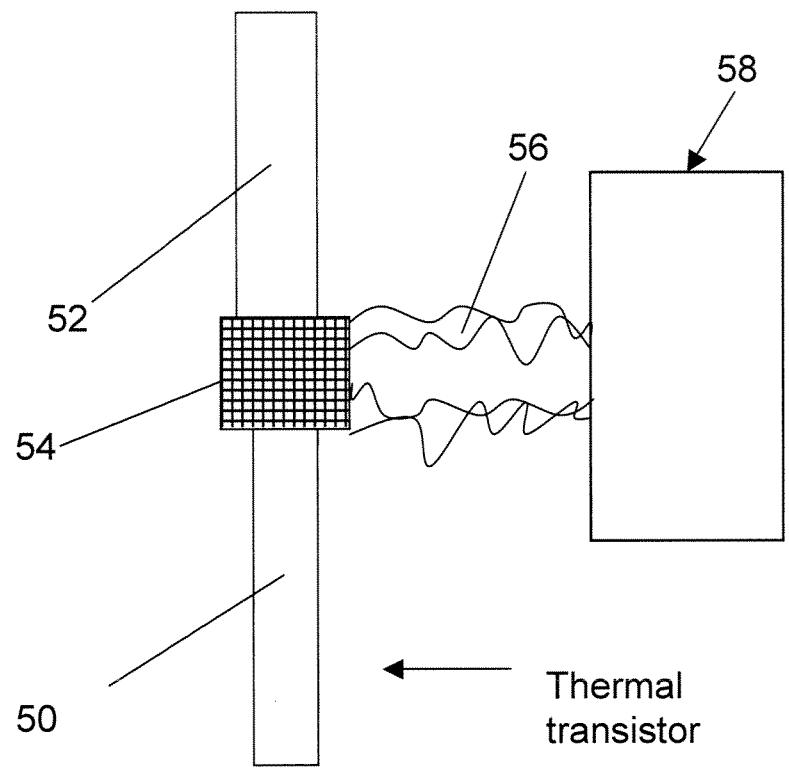
FIG. 5 is a schematic drawing of a waveguide device using the present deformed nanotubes, in a transistor embodiment.

FIG. 5 shows a device in which the waveguide is connected to a transistor having a source 52, a drain 50, and a controllable gate 54 in between. The gate 54 is controlled by heat delivered by the waveguide 56, and this heat is modulated to turn off or on the gate. Such a thermal transistor (not using nanotubes) is further described in Wang, Lei, and Li, Baowen. "Thermal Logic Gates: Computation with Phonons." *Physical Review Letters*, 99, 177208 (2007). The heat control 58 controls heat delivered to the gate 54 by nanotubes 56.

In FIG. 5, nanotubes 56 in various states of nonlinear deformation extend between a heat control 58 and the controllable gate 54, to form a thermal transistor. Another device that may utilize the present nanotube wave-guides is a detector of thermal energy, which converts the incoming phonons into a current. U.S. Pat. No. 4,072,864 to von Gutfeld, issued Feb. 7, 1978, entitled "Multilayered slant-angle thin film energy detector," discloses that In a published letter entitled "Phonon-induced planar voltages in thin metallic films," by von Gutfeld, Tynan and Budd, *Applied Physics Letters*, Vol. 2, Jan. 15, 1976, pp. 78-80, it is shown that any energy producing phonons (i.e., quantized elastic waves or lattice vibrations) such as light, heat or any other thermal source will produce a transverse voltage in slant-angle deposited thin films. Previously, semiconductor films produced at slant angles and optically irradiated had been reported to be photoelectric in nature. The subject letter clarified the fact that what is involved in metallic films is a thermal rather than optical effect. In the subject patent, a temperature gradient is supplied by means for locally directly heating a surface, which means for heating can be a laser, an electron beam or any other source of radiation producing phonons. A radiant energy detector is formed on a substrate of a dielectric material (such as sapphire, quartz, pyrex or other electrical insulating material), which is thermally conductive. A thin film deposit, about 1500 Angstroms thick, of a slant-angle film is deposited upon the substrate by evaporation at a substantial slant angle.

Also, the present wave-guides may be configured with individual nanotubes, as illustrated. When using multiple nanotubes, individual nanotubes may be "tuned" to transport phonons only of a certain energy (e.g., as described below in connection with FIG. 6), and different nanotubes of different properties can be combined. It is possible to "tune," or control thermal conductivity by changing the diameters of the tubes, or by introducing dopants, or physical nicks in the tubes. Thus a mixture of heat "signal" may be resolved by different nanotube waveguides, each of which in effect operates as a band-pass filter, transporting predominantly one energy level of phonon.

As disclosed in U.S. Pat. No. 7,068,865 to Hamann, et al., issued Jun. 27, 2006, entitled "Method and apparatus for thermo-optic modulation of optical signals," thermo-optic control of optical signals may be achieved using photonic crystal structures. A first portion of a split signal is modulated by propagating the signal through a photonic crystal waveguide in which two electrical contacts are laterally spaced from the waveguide region by a plurality of apertures formed through the photonic crystal substrate. A voltage applied across the electrical contacts causes resistive heating of the proximate photonic crystal waveguide through which the signal propagates, thereby modulating the temperature relative to an un-modulated second portion of the split signal that is used as a reference. FIG. 13 of that patent illustrates a top view of another embodiment of a thermo-optic modulation device 1500 incorporating a photonic crystal structure.

Also, as mentioned above, the present devices may be used in flexible electronics, in that the nanotubes maintain their high phonon conductivity even under mechanical changes. Flexible electronic devices are further described in U.S. Pat. No. 6,882,051 to Majumdar, et al., issued Apr. 19, 2005, entitled "Nanowires, nanostructures and devices fabricated therefrom."

Figure 6:
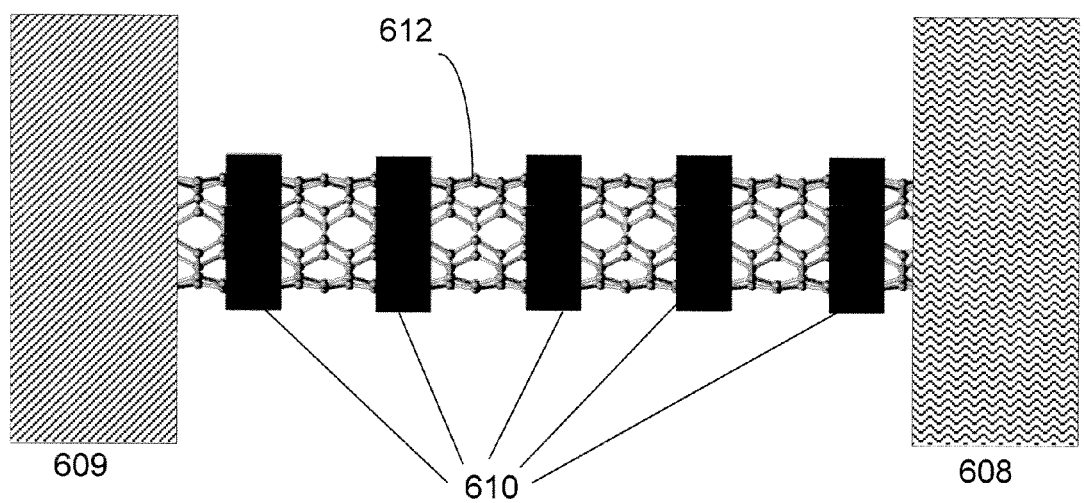
FIG. 6 is a schematic drawing of a design for using a nanotube as a phonon filter.

The present nanotube may be used as a phononic filter that allows a particular frequency and a particular mode of vibration transmitting through the nanotube, while blocking other parts of vibration modes in the phonon spectrum. The schematic design is shown in FIG. 6. As shown there, the nanotube between the heat source 608 and the heat drain 609 has attached to it at periodic intervals a number of structures 610 which functionalize the nanotube as to which wavelengths/frequencies are transmitted. As shown at 610, a number of structures, which are identical as shown, are applied at intervals along the length of the nanotube 612. The distance between the structures may be consistent, i.e., periodic. The nanotube can be functionalized (i.e., by depositing some atoms, by creating defects, or by mechanical deformation) with a periodic structure (e.g., atoms of metal such as gold or other material, or nicks in the graphitic structure interrupting the rhombus carbon atom bonding pattern) or a mixture of the above 50 that only some particular frequencies of phonons can be transmitted. Because the heat conduction in a nanotube is dominated by low frequency phonons, depending on the periodicity and the length of the nanotube, the device can have the capability for filtering phonons of frequencies ranging from 1 kHz to 10 THz. Since traditional piezoelectric devices can only generates frequencies less than 10 GHz, a heat source can be employed to generate phonon frequencies in the THz regime.

The present nanotubes may also be used as synthetic acoustic bandgap (ABG) materials. SBG material is the equivalent of an electronic or photonic bandgap, where a wide range of frequencies are forbidden to exist in a structured material. ABGs thus offer the unique capability to control the propagation and distribution of acoustic waves or phonons. The present devices serve as more efficient transporters of both acoustic and ballistic phonons.

This, in turn, provides a new research tool for studying phonon interactions, and is applicable to acoustic devices such as radio frequency (RF) resonators and filters, ultrasound, and thermal management. The majority of applications and novel physics enabled by ABG materials require solid, low loss structures operating in the 10 MHz to 100 GHz regime with length scales ranging from 100 μm to 10 nm. Prior ABG work has been limited to large, hand-assembled structures operating at frequencies below 1 MHz. However, the present nanotube devices may be scaled to sub-micron length and to frequencies in excess of 1 GHz, where the full potential of this technology can be realized. Interrogation of the ABG may be accomplished by aluminum nitride piezoelectric couplers, integrated on both sides of the bandgap material, that generate and detect acoustic waves. The measured and theoretical transmission of phonons though the ABG material versus frequency, normalized to the phonon transmission through a solid piece of silica, is described in world wide web-dot-sandia-dot-govmission/step/stories/2008/adv_microfab.pdf.

Micro-ABGs are very useful for acoustic isolation of microfabricated devices such as RF resonators and sensors. They can also be fabricated in ways to create novel devices in the acoustic crystal. For example, defects in the micro-ABG lattice through removal of W rods (FIG. 3) have already been used to realize miniature acoustic waveguides that have applications in ultrasound and signal processing. In the future, defected acoustic crystals will be used to realize "minors" for micro-cavities, thus providing higher frequency selectivity than competing technologies. As the ABGs are scaled to even smaller sizes operating at higher frequencies, applications in thermal management and engineering the thermal noise distribution of a material become feasible.

CONCLUSION

The above specific description is meant to exemplify and illustrate the invention and should not be seen as limiting the scope of the invention, which is defined by the literal and equivalent scope of the appended claims. Any patents or publications mentioned in this specification are indicative of levels of those skilled in the art to which the patent or publication pertains as of its date and are intended to convey details of the invention which may not be explicitly set out but which would be understood by workers in the field. Such patents or publications are hereby incorporated by reference to the same extent as if each was specifically and individually incorporated by reference, such incorporation being for the purpose of further describing and enabling the method or material referred to.

REFERENCES

1. Dresselhaus, M. S. & Dai, H. Carbon nanotubes: Continued innovations and challenges. *MRS Bull.* 29, 237-239 (2004).
2. Kim, P., Shi, L., Majumdar, A. & McEuen, P. L. Thermal transport measurements of individual multiwalled nanotubes. *Phys. Rev. Lett.,* 87, 215502 (2001).
3. Fujii, M. et al. Measuring the thermal conductivity of a single carbon nanotube. *Phys. Rev. Lett.,* 95 (2005).
4. Choi, T. Y., Poulikakos, D., Tharian, J. & Sennhauser, U. Measurement of thermal conductivity of individual multi-walled carbon nanotubes by the 3-omega method. *Appl. Phys. Lett.,* 87 (2005).
5. Tang, C., Bando, Y., Sato, T. & Kurashima, K. A novel precursor for synthesis of pure boron nitride nanotubes. *Chem. Commun.,* 1290-1291 (2002).
6. Shi, L. et al. Measuring thermal and thermoelectric properties of one-dimensional nanostructures using a microfabricated device. *J. Heat. Transfer.,* 125, 881-888 (2003).
7. Paulson, S. et al. In situ resistance measurements of strained carbon nanotubes. *Appl. Phys. Lett.,* 75, 2936-2938 (1999).
8. Shan, B., Lakatos, G. W., Peng, S. & Cho, K. J. First-principles study of band-gap change in deformed nanotubes. *Appl. Phys. Lett.,* 87 (2005).
9. Hone, J. et al. Thermoelectric power of single-walled carbon nanotubes. *Phys. Rev. Lett.,* 80, 1042-1045 (1998).
10. Gulseren, O., Yildirim, T., Ciraci, S. & Kilic, C. Reversible band-gap engineering in carbon nanotubes by radial deformation. *Phys. Rev. B,* 65 (2002).
11. Mazzoni, M. S. C. & Chacham, H. Bandgap closure of a flattened semiconductor carbon nanotube: A first-principles study. *Appl. Phys. Lett.,* 76, 1561-1563 (2000).
12. Bradley, K. et al. Is the intrinsic thermoelectric power of carbon nanotubes positive? *Phys. Rev. Lett.,* 85, 4361-4364 (2000).
13. Llaguno, M. C., Fischer, J. E., Johnson, A. T. & Hone, J. Observation of thermopower oscillations in the Coulomb blockade regime in a semiconducting carbon nanotube. *Nano Lett.,* 4, 45-49 (2004).
14. Romero, H. E., Bolton, K., Rosen, A. & Eklund, P. C. Atom collision-induced resistivity of carbon nanotubes. *Science,* 307, 89-93 (2005).
15. Small, J. P., Perez, K. M. & Kim, P. Modulation of thermoelectric power of individual carbon nanotubes. *Phys. Rev. Lett.,* 91 (2003).
16. Hone, J., Whitney, M., Piskoti, C. & Zettl, A. Thermal conductivity of single-walled carbon nanotubes. *Phys. Rev. B,* 59, R2514-R2516 (1999).
17. Chang, C. W., Han, W. Q. & Zettl, A. Thermal conductivity of B-C-N and BN nanotubes. *Appl. Phys. Lett.,* 86, 173102 (2005).
18. Berber, S., Kwon, Y. K. & Tomanek, D. Unusually high thermal conductivity of carbon nanotubes. *Phys. Rev. Lett.,* 84, 4613-4616 (2000).
19. Falvo, M. R. et al. Bending and buckling of carbon nanotubes under large strain. Nature, 389, 582-584 (1997).
20. Poncharal, P., Wang, Z. L., Ugarte, D. & de Heer, W. A. Electrostatic deflections and electromechanical resonances of carbon nanotubes. *Science,* 283, 1513-1516 (1999).

What is claimed is:

1. A nanotube phonon waveguide device, comprising:
   (a) a heat source;
   (b) a heat sink;
   (c) a nanotube attached at one end to the heat sink and at another end to the heat source, said nanotube providing a phonon path between the heat source and the heat sink, said nanotube being mechanically deformed by being bent along its length; and
   (d) a sensor for detecting phonon heat transmission through the nanotube.
2. The device of claim 1 wherein the heat source provides heat between −273° C. and 3000° C.
3. The device of claim 1 wherein the heat source is also an electronic source and the sensor also senses electron flow through the nanotube.
4. The device of claim 1 wherein the nanotube is one of an SWNT, MWCNT, BNNT and silicon nanotube.
5. The device of claim 4 wherein the nanotube is between about 10 nm to $10^8$ nm in length.
6. The device of claim 1 wherein the nanotube is between about 10 nm to $10^8$ nm in length.
7. The device of claim 1 further comprising structure permitting differential deformation of the nanotube, and wherein the nanotube may be deformed by movement of said structure.
8. The device of claim 7 wherein the differential deformation is coupled to the sensor to act as a band pass filter, wherein thermal conductivity increases with deformation, in that there is a semiconducting to metal transition during bending.
9. The device of claim 8 wherein the heat source is also an electronic source and the sensor also senses electron flow through the nanotube, and said sensor is adapted to detect greater electronic resistance with greater deformation.
10. The device of claim 1 wherein the heat source provides heat between 50° C. and 100° C.
11. The device of claim 1 wherein the nanotubes are between about 10 nm to 40 nm in length.
12. The device of claim 1 wherein the nanotube is a graphyne nanotube.
13. The device of claim 1 wherein the nanotube is an MWCNT which is metallic.
14. The device of claim 1 wherein the nanotube is an MWNT which is semiconducting.
15. The device of claim 1 wherein the nanotube is a boron nitride nanotube having either a single layer or multiple layers.
16. A nanotube phonon waveguide device, comprising:
   (a) a heat source;
   (b) a heat sensor;
   (c) a plurality of carbon nanotubes attached at one end to the heat source and at another end the heat sensor, at least one of said carbon nanotubes being mechanically deformed by being bent along its length;
   (d) said heat sensor being arranged for detecting phonon heat transmission through the plurality of nanotubes; and
   (e) an actuator for changing distance between the heat source and the heat sensor.
17. The device of claim 16 wherein at least one of said plurality of carbon nanotubes is functionalized to modify wavelengths which can be transmitted by a functionalized carbon nanotube.

* * * * *